United States Patent [19]
Kordts et al.

[11] Patent Number: 5,343,165
[45] Date of Patent: Aug. 30, 1994

[54] AMPLIFIER HAVING A SYMMETRICAL OUTPUT CHARACTERISTIC

[75] Inventors: Jürgen Kordts, Norderstedt; Axel Näthe; Paul Sonnenberger, both of Hamburg, all of Fed. Rep. of Germany

[73] Assignee: U.S. Philips Corporation, New York, N.Y.

[21] Appl. No.: 969,630

[22] Filed: Oct. 30, 1992

[30] Foreign Application Priority Data

Nov. 7, 1991 [DE] Fed. Rep. of Germany ....... 4136605

[51] Int. Cl.⁵ .............................................. H03F 3/26
[52] U.S. Cl. ..................................... 330/262; 330/269
[58] Field of Search ............... 330/262, 269, 288, 300, 330/272, 273, 274

[56] References Cited

U.S. PATENT DOCUMENTS

| | | | |
|---|---|---|---|
| 3,693,106 | 9/1972 | Long et al. | 330/262 |
| 3,900,790 | 8/1975 | Ohsawa | 330/262 X |
| 4,446,443 | 5/1984 | Johnson et al. | 330/257 |

FOREIGN PATENT DOCUMENTS

| | | | |
|---|---|---|---|
| 3142607 | 5/1983 | Fed. Rep. of Germany. | |
| 0247111 | 11/1986 | Japan | 330/262 |
| 0023705 | 1/1990 | Japan | 330/262 |
| WO8202805 | 8/1982 | PCT Int'l Appl. | |
| 0843164 | 6/1981 | U.S.S.R. | 330/262 |

*Primary Examiner*—Steven Mottola
*Attorney, Agent, or Firm*—Bernard Franzblau

[57] ABSTRACT

A symmetrical amplifier includes a current mirror circuit and a current splitting circuit. The current splitting circuit splits up an input signal applied to the amplifier as a function of the signal polarity. Negative input currents are applied to the current mirror circuit whose controlled output current is applied to a control input of a first current amplifier circuit arranged in the amplifier. In order to insure symmetrical operation of the amplifier, positive input currents flowing into the amplifier are applied to a control input of a second current amplifier circuit arranged in the amplifier. The second current amplifier circuit is the same as the first current amplifier circuit. The first current amplifier circuit is connected to a positive supply voltage and the second current amplifier circuit is connected to a negative power supply voltage, and the two current amplifier circuits operate into a common load at their output ends.

25 Claims, 2 Drawing Sheets

AMPLIFIER HAVING A SYMMETRICAL OUTPUT CHARACTERISTIC

BACKGROUND OF THE INVENTION

This invention relates to an amplifier comprising a current mirror circuit and a current splitting circuit which splits up an input signal applied to the amplifier dependent upon the signal polarity, and in which negative input currents flowing out of the amplifier are applied to the current mirror circuit whose controlled output current is applied to a control input of a first current amplifier circuit arranged in the amplifier.

An amplifier of this type is known from U.S. Pat. No. 4,446,443. In this amplifier the input current is applied to a first current mirror circuit or a second current mirror circuit, dependent on its polarity. The first current mirror circuit controls the base input of an NPN transistor. The second current mirror circuit generates a current in an NPN transistor at the other polarity, which transistor is connected at its collector end to the output load and at its emitter end to the second current mirror circuit. This different connection of the two output transistors results in an asymmetrical behaviour of the circuit so that the output signal is different dependent on the polarity of the input signal.

SUMMARY OF THE INVENTION

It is an object of the invention to provide an amplifier of the type described in the opening paragraph which operates symmetrically.

According to the invention this object is achieved in that positive input currents flowing into the amplifier are applied to a control input of a second current amplifier circuit arranged in the amplifier, which second current amplifier circuit has the same structure as the first current amplifier circuit, in that the first current amplifier circuit is connected to a positive power supply voltage and the second current amplifier circuit is connected to a negative power supply voltage, and in that the two current amplifier circuits operate on a common load at their output ends.

The amplifier according to the invention thus comprises two current amplifier circuits which have the same structure and consequently also the same behaviour. In order that the two current amplifier circuits operate symmetrically, a current splitting circuit is provided which applies positive input currents flowing into the amplifier directly to a control input of the second current amplifier circuit. Currents of inverted polarity, i.e. negative currents, flowing out of the amplifier are used for controlling the control input of the first current amplifier circuit in the same manner. For this purpose a current mirror circuit is additionally provided which ensures that the first current amplifier circuit is controlled for negative currents in the same way as the second current amplifier circuit is controlled for positive input currents. In this way a fully symmetrical behavior of the amplifier is achieved.

The two current amplifier circuits are controlled via currents so that small voltage changes occur in the control circuit and parasitic capacitances present in this circuit should be reversed in charge to a small extent. The structure of the amplifier also ensures that the output voltage does not fall below the negative power supply voltage so that no parasitic effect occurs when the amplifier is built up as an integrated circuit. The amplifier does not comprise any PNP transistors in the power stages. This ensures a relatively high stability. These advantages are achieved with a low number of circuit components.

In a first embodiment of the invention the first current amplifier circuit includes an NPN transistor whose collector is connected to the positive power supply voltage, whose emitter is connected to the load and whose base represents the control input, and the second current amplifier circuit includes an NPN transistor whose collector is connected to the load, whose emitter is connected to the negative power supply voltage and whose base represents the control input.

In this first embodiment the two current amplifier circuits operate with one NPN transistor each. In spite of the simple structure of the circuit the above-described advantages are achieved. More particularly, NPN transistors have the advantages of a greater stability as compared with output circuits including PNP transistors.

In a second embodiment of the invention the two current amplifier circuits include a Darlington circuit of two NPN transistors each, in which the collectors of the two transistors in the first current amplifier circuit are connected to the positive power supply voltage and the emitter of the output transistor is connected to the load, and in which the collectors of the two transistors in the second current amplifier circuit are connected to the load and the emitter of the output transistor is connected to the negative power supply voltage.

Due to the Darlington circuits a high current amplification can be achieved because the current amplification results from the multiplication of the current amplification values of the individual transistors of a Darlington circuit. In the amplifier circuit known from U.S. Pat. No. 4,446,443 such a high current amplification can only be achieved by a corresponding layout of the second current mirror, but this would involve a much larger number of components.

In accordance with the first and second embodiments of the invention, the current splitting circuit is preceded at its input end by a resistor which is dimensioned in such a way that the current splitting circuit has substantially the same input resistance at the input end as the control inputs of the current amplifier circuits.

As a result of the provision of this series resistor at the input of the current splitting circuit, the input current is subjected to an equal input resistance, independent of its polarity. At one polarity the input current is applied to a control input of the one current amplifier circuit. At the other polarity the current splitting circuit ensures that the current reaches the control input of the other current amplifier circuit via the current mirror circuit. In this case the input of the current splitting circuit thus constitutes the input resistance which, by means of the series resistance, can be chosen to be approximately equal to the input resistances of the current amplifier circuits.

In a third embodiment according to the invention, the first current amplifier circuit includes a field effect transistor whose source is connected to the positive power supply voltage, whose drain is connected to the load and whose gate, which is connected to the drain via a resistor, constitutes the control input of the first current amplifier circuit. The second current amplifier circuit includes a field effect transistor whose source is connected to the load, whose drain is connected to the negative power supply voltage and whose gate, which is connected to the drain via a resistor, constitutes the control input of the second current amplifier circuit. The use of field effect transistors in the current amplifier circuits has the special advantage that due to the small drain-to-source forward resistance (RDON), no saturation voltages and hence smaller dissipations are achievable as compared with solutions using NPN transistors.

In a further embodiment of the invention the current splitting circuit is constituted as a current mirror. If the input current is zero, a forward current, which thus does not flow through the load, flows through the transistors of the two current amplifier circuits. The switching point of this forward current at a small negative or small positive input current is temperature-dependent in simple current splitting circuits. When a current mirror is used, this temperature dependence can be substantially eliminated so that the quiescent current changes to a small extent only and the crossover distortion remains small. In a further embodiment of the invention the current splitting circuit for such a current mirror includes a first NPN transistor whose emitter constitutes the input of the current splitting circuit and which is connected to the control input of the second current amplifier circuit, whose collector supplies the control current for the current mirror and whose base is connected to the base and to the collector of a second NPN transistor whose collector receives a reference current and whose emitter is coupled to the negative power supply voltage. A positive input current flowing into the amplifier almost exclusively reaches the control input of the second current amplifier circuit because the first transistor blocks the current splitting circuit. In the case of a negative current flowing out of the amplifier, this current essentially flows through the first transistor of the current splitting circuit and reaches the control input of the first current amplifier circuit via the current mirror circuit.

The reference voltage applied to the emitter of the second transistor of the current splitting circuit or the current mirror is to be chosen in dependence upon the voltage decreasing at the base-emitter path of the transistor(s) in the second current amplifier circuit. Consequently, in the first embodiment according to the invention, a diode is arranged between the second transistor of the current splitting circuit and the negative power supply voltage. In the second embodiment, which includes a Darlington circuit, two diodes are arranged in series. For the third embodiment, i.e., with field effect transistors in the current amplifier circuits, a simple resistor is sufficient.

BRIEF DESCRIPTION OF THE DRAWING

Three embodiments of the invention will be described in greater detail with reference to the accompanying drawings, in which.

DESCRIPTION OF THE PREFERRED EMBODIMENTS

Figure 1:
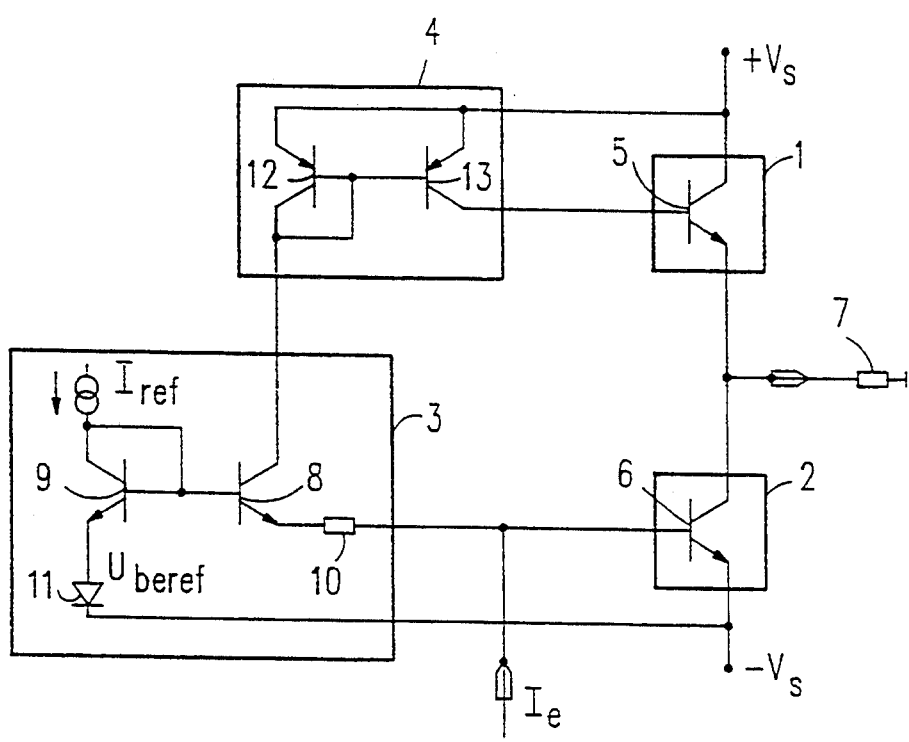
FIG. 1 shows a first embodiment of the amplifier according to the invention, including an NPN transistor in the current amplifier stages.

A first embodiment shown in FIG. 1 comprises a first current amplifier stage 1, a second current amplifier stage 2, a current splitting circuit 3 and a current mirror circuit 4. The first current amplifier circuit 1 includes an NPN transistor 5 whose collector is connected to a positive power supply voltage $+V_s$. The emitter of the transistor 5 is connected to the collector of an NPN transistor 6 arranged in the second current amplifier circuit 2. This junction point between the emitter of the transistor 5 and the collector of the transistor 6 represents the output of the amplifier which may be connected, for example, to a load 7, as is shown in FIG. 1. The emitter of the transistor 6 is connected to a negative power supply voltage $-V_s$. The respective base terminals of the transistors 5 and 6 represent the control inputs of the current amplifier circuits 1 and 2, respectively.

An input current $I_e$ applied to the amplifier shown in FIG. 1 is applied to the control input of the second current amplifier circuit 2 as well as to the current splitting circuit 3.

The current splitting circuit 3 comprises a current mirror circuit having a first transistor 8 and a second transistor 9, both in the form of NPN transistors.

The input current $I_e$ is applied via a resistor 10 to the emitter of the first transistor 8 whose collector supplies the output current of the current splitting circuit, which current is applied to the current mirror 4.

The base of the first transistor 8 of the current splitting circuit 3 is connected to the base of the second transistor 9 and to its collector. A reference current $L_{ref}$ is applied to the collector of the transistor 9. The emitter of the transistor 9 is connected to the negative power supply voltage $-V_s$ via a diode 11, whose anode end is connected to the emitter of the transistor 9.

The current supplied by the collector of the first transistor 8 of the current splitting circuit 3 is applied to a current mirror circuit 4 in which two PNP transistors are arranged in known manner as a current mirror circuit. The current mirror circuit comprises a first transistor 12 whose collector and whose base receive the current coming from the current splitting circuit 3. The emitter of this transistor 12 as well as the emitter of a second transistor 13 of the current mirror circuit 4 are connected to the positive power supply voltage $+V_s$. The bases of these two transistors are interconnected. The collector of the second transistor 13 supplies the output signal of the current mirror circuit 4, which signal is applied to the control input of the first current amplifier circuit 1.

The operation of the amplifier as shown in FIG. 1 will now be further described.

In the following description a positive input current $I_e$ will be assumed to be a current flowing into the amplifier and a negative input current will be assumed to be an input current flowing out of the amplifier.

The input current $I_e$ is distributed over the control inputs of the two current amplifier circuits 1 and 2 in dependence upon its sign and with the aid of the current splitting circuit 3 and the current mirror 4. If the current is positive, the overall current flows in the control input of the second current amplifier circuit 2 so that in accordance with the current gain factor of the transistor 6 a correspondingly larger current flows in the load. When the transistor 6 of the second current amplifier circuit is activated, this current is quasi-withdrawn from the load 7 and flows in a direction opposite to that of the power supply voltage $-V_s$. In the case of a negative input current this current reaches the control input of the first current amplifier circuit 1 via the current splitting circuit 3 and the current mirror 4 so that a corresponding current flows from $+V_s$ into the load 7, dependent on the current gain factor of the transistor 5. The current flowing in the control input of the first current amplifier circuit 1 is an accurate image of the input current, however, with a reversed polarity. In this way a fully symmetrical behaviour of the circuit is achieved.

The operation of the current splitting circuit will now be further described.

It will be assumed that the input current $I_e$ is zero. Dependent on the reference current $I_{ref}$ applied to the second transistor 9 of the current splitting circuit and the reference voltage $U_{beref}$ generated by the diode 11, a collector current flows in the first transistor 8 of the current splitting circuit 3. A substantially equal current flows out of the emitter of the transistor 8 and is applied to the control input of the second current amplifier circuit, thus to the base of transistor 6. The collector current of the transistor 8 of the current splitting circuit 3 is applied to the current mirror circuit 4 and, via this circuit, with a reversed polarity to the control input of the first current amplifier circuit 1, i.e. to the base of its transistor 5. Thus, an equal current is applied to the two control inputs of the current amplifier circuits so that the base currents of the transistors 5 and 6 are equally large and equal currents also flow in the collectors. In this case no current flows through the load 7 and the arrangement is at its crossover point.

If the input current $I_e$ is positive, i.e. if it flows into the circuit, this current is completely applied to the base of the transistor 6, i.e. the control input of the second current amplifier circuit 2. The base-emitter voltage at the transistor 6 increases accordingly, so that the base-emitter voltage of the transistor 8 of the current splitting circuit 3 becomes correspondingly smaller. As a result, the transistor 8 is turned off rapidly so that its collector current becomes zero. The current mirror circuit 4 thus does not receive any current so that no current is applied to the control input of the first current amplifier circuit 1, which in turn results in the transistor 5 being turned off. Consequently, a current only flows out of the load which is controlled by the second current amplifier circuit 2.

However, if the input current $I_e$ is negative, this current completely flows through the transistor 8 of the current splitting circuit 3 and is applied through the current mirror 4 to the control input of the first current amplifier circuit 1, i.e. to the base of its transistor 5. Since this input current $I_e$ flows through the transistor 8, its base-emitter voltage increases so that the base-emitter voltage of the transistor 6 of the second current amplifier circuit 2 becomes correspondingly smaller and consequently this transistor is turned off rapidly. In the case of a negative input current the current flowing through the load 7 is exclusively determined by the first current amplifier circuit 1. A current flows from the positive power supply voltage $+V_s$ to the load 7.

The two transistors 8 and 9 jointly constitute a current mirror in the current splitting circuit 3. This current mirror has the particular advantage that the quiescent current which flows through the two transistors 5 and 6 at an input current of $I_e=0$ is not dependent on temperature. In this case it must hold that the diode 11 should have the same temperature as the transistor 6 of the second current amplifier circuit. This condition can be easily fulfilled when the circuit is integrated. Spreads of elements also result in a small variation of this quiescent current. The resistor 10 arranged at the input of the current splitting circuit 3 has the particular advantage that an additional voltage drop is realised via this resistor, which voltage drop ensures that already at a small negative input current $I_e$ the base-emitter voltage of the transistor 6 will become so small that the transistor 6 is turned off at an early instant.

The circuit has the further advantage that the parasitic effect is prevented. For this purpose it is necessary to prevent the output voltage from decreasing below $-V_s$. If, for example, the load 7 has an inductive characteristic, a voltage could be induced that would cause the collector voltage of the transistor 6 to decrease below $-V_s$ is the case of rapid switching actions. However, the base of the transistor 6 is at a potential which is higher than $-V_s$ by a base-emitter voltage. Thus if the collector voltage of transistor 6 moves towards $-V_s$, the collector base diode will become inversely conducting and a current will flow from the emitter of the transistor 8 into the load via the conducting base-collector path of the transistor 6. A current, which is mirrored via the current mirror 3 in the base of the transistor 5 of the first current amplifier circuit 1, then also flows in the collector of the transistor 8. As a result, the transistor 5 is turned on and counteracts the further decrease of the collector voltage of the transistor 6 so that this potential is clamped at $-V_s$ and there is no decrease below this potential.

Figure 2:
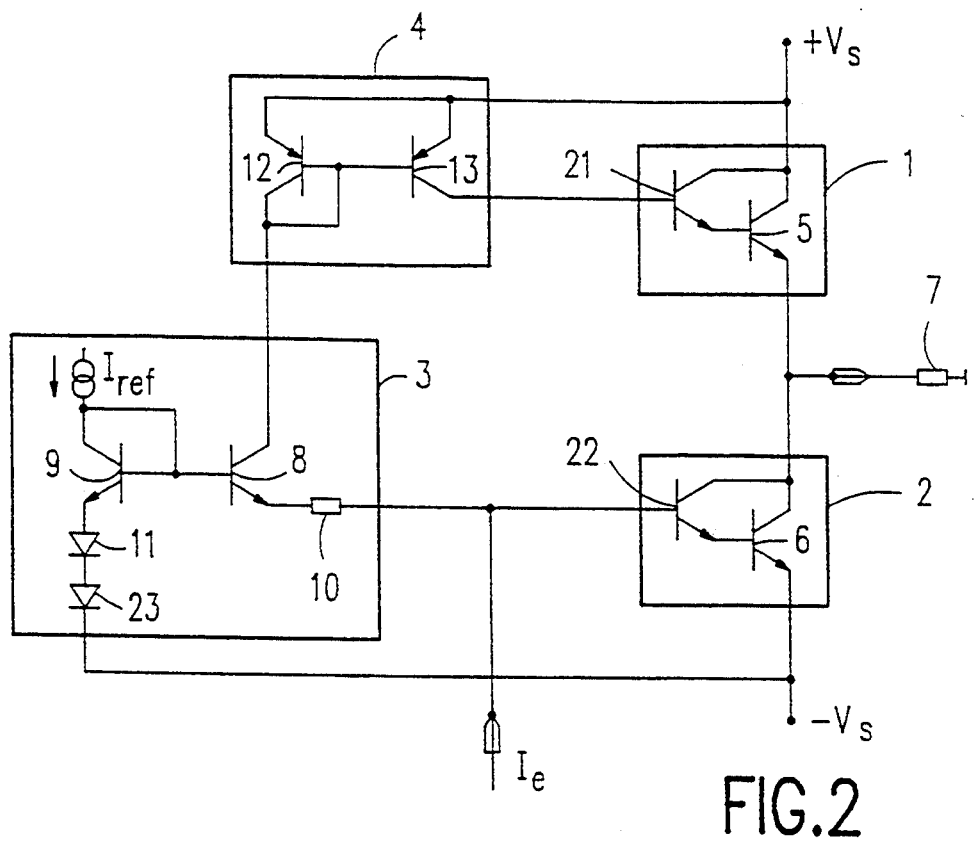
FIG. 2 shows a second embodiment with a Darlington circuit in the current amplifier circuits.

With respect to the input current $I_e$, the circuit of FIG. 1 supplies a current amplification in accordance with the current amplifications of the two output transistors 5 and 6. In many cases a higher current amplification is desirable, which can be achieved in a simple manner with a second embodiment of the amplifier circuit shown in FIG. 2. The amplifier shown in FIG. 2 has substantially the same structure as the amplifier shown in FIG. 1. The amplifier of FIG. 2 is only distinguished by the structure of the two current amplifier circuits 1 and 2 and by a corresponding adaptation of the current mirror circuit of the current splitting circuit 3.

In the first current amplifier circuit 1 of the circuit according to FIG. 2a further transistor 21 is coupled to the transistor 5 so that together they form a Darlington circuit. The collector of the transistor 21 is connected to the positive power supply voltage $+V_s$ and to the collector of the transistor 5. The emitter of the transistor 21 is connected to the base of the transistor 5. The base of the transistor 21 constitutes the control input of the current amplifier circuit 1. The emitter of the transistor 5 is again connected to the load 7.

In the second current amplifier circuit a transistor 22 is coupled to the transistor 6 with which it forms a Darlington circuit in a corresponding manner. The base of the transistor 22 constitutes the control input of the second current amplifier circuit 2.

For the operation of the current splitting circuit 3 and the current mirror circuit arranged in this current splitting circuit it should be noted that the Darlington circuit with the two transistors 6 and 22 constitutes two base-emitter paths so that a further diode 23 should be included, in addition to the diode 11, in the current splitting circuit 3. By means of the circuit according to FIG. 2 a current amplification is achieved which is formed from the multiplication of the current gain factors of the transistors 21 and 5, and of transistors 22 and 6. A very high current amplification is achieved with an extremely simple structure in this case.

Figure 3:
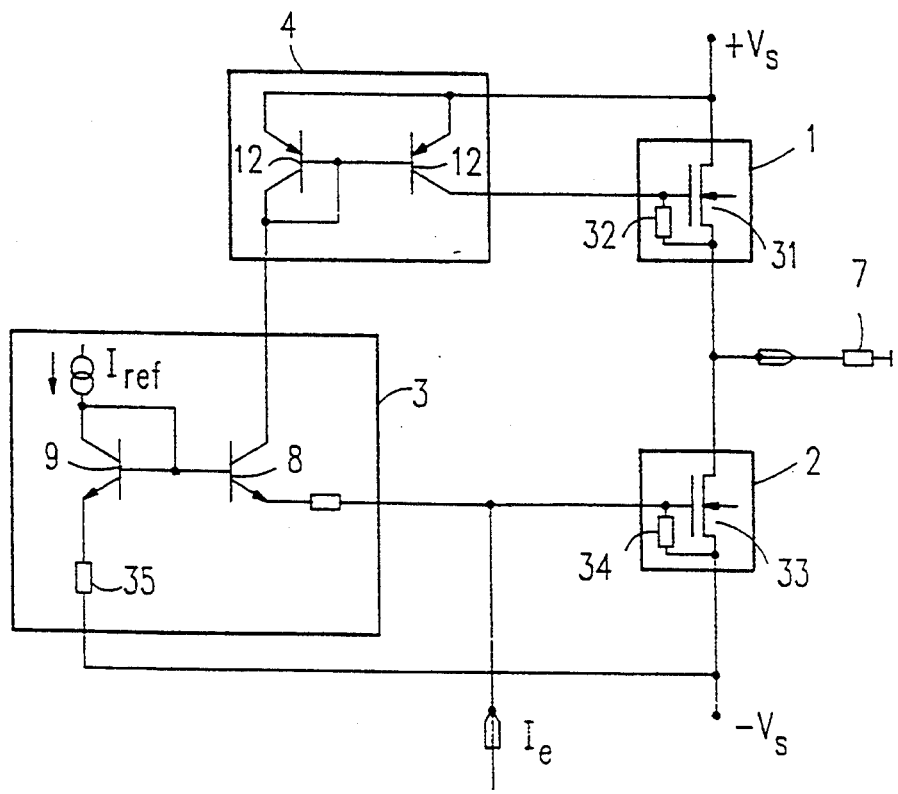
FIG. 3 shows a third embodiment with a field effect transistor in the current amplifier circuits.

FIG. 3 shows a third embodiment of the amplifier according to the invention whose structure is substantially identical to that of the second embodiment of FIG. 2 and to the first embodiment of FIG. 1, with the exception that a field effect transistor is arranged in the current amplifier circuits 1 and 2.

The first current amplifier circuit 1 includes a field effect transistor 31 whose source is connected to the positive power supply voltage $+V_S$. The gate of the field effect transistor 31 constitutes the control input of the current amplifier circuit 1 and is connected via a resistor 32 to the drain of the field effect transistor 31 which is connected to the load 7.

The second current amplifier circuit 2 includes a field effect transistor 33 whose source is connected to the load 7. The drain of the transistor 33 is connected to the negative power supply voltage $-V_S$ and is connected via a resistor 34 to the gate of the field effect transistor 33 which also constitutes the control input of the current amplifier circuit 2.

Furthermore, in the third embodiment according to FIG. 3 the reference voltage and the coupling of the transistor 9 of the current mirror circuit in the current splitting circuit 3 with the negative power supply voltage $-V_S$ is to be adapted in accordance with the voltage drop between the control input of the second current amplifier circuit 2 and the power supply voltage $-V_S$. A resistor 35 is therefore arranged between the emitter of the second transistor 9 and the negative power supply voltage $-V_S$.

The operation of the circuit of the second embodiment according to FIG. 2 and the circuit of the third embodiment according to FIG. 3 corresponds to the operation of the circuit of the first embodiment according to FIG. 1, with the differences described hereinbefore.

We claim:

1. An amplifier comprising: a current mirror circuit, a current splitting circuit which splits up an input signal applied to the amplifier dependent upon the signal polarity, wherein negative and positive input currents flow out of and into the amplifier, respectively, and the negative input currents are applied to the current mirror circuit whose controlled output current is applied to a control input of a first current amplifier circuit arranged in the amplifier, characterized in that the positive input currents are applied to a control input of a second current amplifier circuit arranged in the amplifier, which second current amplifier circuit has the same structure as the first current amplifier circuit, in that the first current amplifier circuit is connected to a positive power supply voltage and the second current amplifier circuit is connected to a negative power supply voltage, and in that the first and second current amplifier circuits operate into a common load at their output ends.

2. An amplifier as claimed in claim 1, wherein the first current amplifier circuit includes an NPN transistor having a collector connected to the positive power supply voltage and an emitter connected to the load and whose base comprises the control input, and the second current amplifier circuit includes an NPN transistor having a collector connected to the load and an emitter connected to the negative power supply voltage and whose base comprises the control input.

3. An amplifier as claimed in claim 1, wherein the first and second current amplifier circuits each include a Darlington circuit comprising two NPN transistors, in which the collectors of the two transistors in the first current amplifier circuit are connected to the positive power supply voltage and the emitter of the output transistor is connected to the load, and in which the collectors of the two transistors in the second current amplifier circuit are connected to the load and the emitter of the output transistor is connected to the negative power supply voltage.

4. An amplifier as claimed in claim 3, wherein the current splitting circuit is preceded at its input end by a resistor which is dimensioned such that the current splitting circuit has substantially the same input resistance at the input end as the control inputs of the current amplifier circuits.

5. An amplifier as claimed in claim 1, wherein the first current amplifier circuit includes a field effect transistor having a source connected to the positive power supply voltage and a drain connected to the load and whose gate is connected to the drain via a resistor and constitutes the control input of the first current amplifier circuit, and in that the second current amplifier circuit includes a field effect transistor having a source connected to the load and a drain connected to the negative power supply voltage and whose gate, which is connected to its drain via a resistor, constitutes the control input of the second current amplifier circuit.

6. An amplifier as claimed in claim 1 wherein the current splitting circuit comprises a second current mirror circuit, wherein said first and second current mirror circuits comprise transistors of the same polarity type.

7. An amplifier as claimed in claim 1, wherein the current splitting circuit comprises a current mirror that includes a first NPN transistor whose emitter is the input of the current splitting circuit and which is connected to the control input of the second current amplifier circuit, whose collector supplies the control current for the current mirror circuit and whose base is connected to the base and to the collector of a second NPN transistor whose collector receives a reference current and whose emitter is coupled to the negative power supply voltage.

8. An amplifier as claimed in claim 7, wherein the emitter of the second NPN transistor of the current splitting circuit is coupled to the negative power supply voltage via a diode whose anode end is connected to the emitter of the second NPN transistor.

9. An amplifier as claimed in claim 7, wherein the emitter of the second NPN transistor of the current splitting circuit is coupled to the negative power supply voltage via two diodes which are series-arranged in the same direction, one diode being connected at its anode end to the emitter of the second NPN transistor.

10. An amplifier as claimed in claim 7, wherein the emitter of the second NPN transistor of the current splitting circuit is coupled to the negative power supply voltage via a resistor.

11. An amplifier as claimed in claim 2, wherein the current splitting circuit is preceded at its input end by a resistor which is dimensioned such that the current splitting circuit has substantially the same input resistance at the input end as the control inputs of the current amplifier circuits.

12. An amplifier as claimed in claim 7, wherein the first current amplifier circuit includes an NPN transistor having a collector connected to the positive power supply voltage and an emitter connected to the load and whose base comprises the control input, and the second current amplifier circuit includes an NPN transistor having a collector connected to the load and an emitter connected to the negative power supply voltage and whose base comprises the control input, wherein the emitter of the second NPN transistor of the current splitting circuit is coupled to the negative power supply voltage via a diode whose anode end is connected to the emitter of the second NPN transistor.

13. An amplifier as claimed in claim 7, wherein the first and second current amplifier circuits each include a Darlington circuit comprising two NPN transistors in which the collectors of the two transistors in the first current amplifier circuit are connected to the positive power supply voltage and the emitter of the output transistor is connected to the load, and in which the collectors of the two transistors in the second current amplifier circuit are connected to the load and the emitter of the output transistor is connected to the negative power supply voltage, and the emitter of the second NPN transistor of the current splitting circuit is coupled to the negative power supply voltage via two diodes which are series-arranged in the same direction, one diode being connected at its anode end to the emitter of the second NPN transistor.

14. An amplifier as claimed in claim 7, wherein the first current amplifier circuit includes a field effect transistor whose source is connected to the positive power supply voltage, whose drain is connected to the load and whose gate is connected to the drain via a resistor and comprises the control input of the first current amplifier circuit, and in that the second current amplifier circuit includes a field effect transistor whose source is connected to the load, whose drain is connected to the negative power supply voltage and whose gate, which is connected to its drain via a resistor, comprises the control input of the second current amplifier circuit, and the emitter of the second NPN transistor of the current splitting circuit is coupled to the negative power supply voltage via a resistor.

15. An amplifier comprising:
first and second supply voltage terminals for the amplifier,
a first current amplifier circuit,
a second current amplifier circuit which is similar to the first current amplifier circuit,
means coupling the first and second current amplifier circuits in series between said first and second supply voltage terminals,
an output of the amplifier coupled to a junction point between the first and second current amplifier circuits,
a signal input terminal by means of which positive and negative input currents flow into and out of the amplifier dependent upon signal polarity,
a current splitting circuit having first and second terminals,
means connecting the signal input terminal to a control input of the second current amplifier circuit and to said first terminal of the current splitting circuit, and
a current mirror circuit having an output coupled to a control input of the first current amplifier circuit and an input coupled to the second terminal of the current splitting circuit whereby a current flow in the control input of the first current amplifier circuit is an accurate image of the input current, but with a reverse polarity, such that the amplifier provides a symmetrical response to positive and negative input signals.

16. An amplifier as claimed in claim 15 wherein the first and second current amplifier circuits each include an NPN transistor and said first and second supply voltage terminals supply a positive and a negative voltage, respectively, relative to ground and of equal value.

17. An amplifier as claimed in claim 15 further comprising diode means coupled in series with a third terminal of the current splitting means and the second supply voltage terminal.

18. An amplifier as claimed in claim 17 wherein said diode means and an amplifier transistor in the second current amplifier circuit are arranged to be subject to the same temperature.

19. An amplifier as claimed in claim 15 wherein the first and second current amplifier circuits each include a bipolar transistor of the same conductivity type and said first and second supply voltage terminals supply a positive and a negative voltage, respectively, relative to ground.

20. An amplifier as claimed in claim 19 further comprising a resistor coupled in series with the first terminal of the current splitting circuit and said signal input terminal.

21. An amplifier as claimed in claim 15 wherein the signal input terminal is directly connected to the control input of the second current amplifier circuit.

22. An amplifier as claimed in claim 21 wherein the current splitting circuit comprises a second current mirror circuit.

23. An amplifier as claimed in claim 22 wherein the amplifier output is adapted for connection to a load having an inductive characteristic whereby switching of a transistor in at least one of the first and second current amplifier circuits induces a voltage which causes a reverse base-collector current to flow in the transistor of the second current amplifier circuit and which is mirrored via the current mirror circuits to the control input of the first current amplifier circuit in a manner so as to counteract the induced voltage and thereby clamp the collector voltage of the transistor of the second amplifier circuit at the voltage of the second supply voltage terminal.

24. An amplifier as claimed in claim 1 further comprising;
a signal input terminal for said input signal and coupled to said current splitting circuit and to said control input of the second current amplifier circuit such that the first current amplifier circuit receives drive current via the current splitting circuit and the current mirror circuit and the second current amplifier circuit receives its drive current via a current path that is independent of the current splitting circuit.

25. An amplifier as claimed in claim 1 further comprising;
a signal input terminal for said input signal and coupled to said current splitting circuit and directly to said control input of the second current amplifier circuit.

* * * * *